(12) United States Patent
Lu et al.

(10) Patent No.: US 11,961,740 B2
(45) Date of Patent: Apr. 16, 2024

(54) MANUFACTURING METHOD FOR INTEGRATING GATE DIELECTRIC LAYERS OF DIFFERENT THICKNESSES

(71) Applicant: SHANGHAI HUALI INTEGRATED CIRCUIT CORPORATION, Shanghai (CN)

(72) Inventors: Lian Lu, Shanghai (CN); Yizheng Zhu, Shanghai (CN); Xiangguo Meng, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 361 days.

(21) Appl. No.: 17/516,589

(22) Filed: Nov. 1, 2021

(65) Prior Publication Data
US 2022/0139711 A1 May 5, 2022

(30) Foreign Application Priority Data
Nov. 2, 2020 (CN) .......................... 202011201972.9

(51) Int. Cl.
| | |
|---|---|
| *H01L 21/28* | (2006.01) |
| *H01L 21/308* | (2006.01) |
| *H01L 21/67* | (2006.01) |
| *H01L 21/768* | (2006.01) |

(52) U.S. Cl.
CPC .. *H01L 21/28185* (2013.01); *H01L 21/28202* (2013.01); *H01L 21/3086* (2013.01); *H01L 21/67075* (2013.01); *H01L 21/76802* (2013.01)

(58) Field of Classification Search
CPC ........... H01L 21/28185; H01L 21/3086; H01L 21/6802; H01L 21/823462
See application file for complete search history.

(56) References Cited

U.S. PATENT DOCUMENTS

| | | | | |
|---|---|---|---|---|
| 7,354,830 | B2 * | 4/2008 | Lin ................. | H01L 21/823462 |
| | | | | 438/275 |
| 9,142,566 | B2 * | 9/2015 | Hong .................. | H01L 27/1203 |
| 9,224,826 | B2 * | 12/2015 | Kwon ............... | H01L 29/42368 |
| 9,847,399 | B1 * | 12/2017 | Lin ..................... | H01L 29/0649 |
| 10,985,071 | B1 * | 4/2021 | Yang ............... | H01L 21/823857 |
| 11,843,043 | B2 * | 12/2023 | Shima-Edelstein ......................... |  |
| | | | | H01L 21/823462 |
| 2002/0072168 | A1 * | 6/2002 | Tseng ............. | H01L 21/823857 |
| | | | | 257/E21.639 |
| 2002/0185693 | A1 * | 12/2002 | Yasuda ............... | H01L 21/3145 |
| | | | | 257/E21.268 |

(Continued)

*Primary Examiner* — Bac H Au
(74) *Attorney, Agent, or Firm* — Alston & Bird LLP

(57) ABSTRACT

The present application discloses a method for manufacturing semiconductor devices having gate dielectric layers at different thickness. The gate dielectric layers having other than the minimum thickness are respectively formed by the following steps: step 1: forming a first mask layer; step 2: etching the first mask layer to form a first opening; step 3: etching a semiconductor substrate at the bottom of the first opening to form a second groove; step 4: filling the second groove and the first opening with the second material layer; step 5: etching back the second material layer to form the gate dielectric layer, such that the second material layer is flush with the top surface of the semiconductor substrate; and step 6: removing the first mask layer.

15 Claims, 6 Drawing Sheets

(56) References Cited

U.S. PATENT DOCUMENTS

| | | | |
|---|---|---|---|
| 2003/0015763 A1* | 1/2003 | Yoneda | H01L 21/28185 |
| | | | 257/E21.639 |
| 2003/0157772 A1* | 8/2003 | Wieczorek | H01L 21/823857 |
| | | | 257/E21.639 |
| 2005/0136632 A1* | 6/2005 | Rotondaro | H01L 21/28202 |
| | | | 438/591 |
| 2006/0292803 A1* | 12/2006 | Lin | H10B 41/40 |
| | | | 257/E27.081 |
| 2014/0091400 A1* | 4/2014 | Lee | H01L 29/513 |
| | | | 257/392 |
| 2015/0024564 A1* | 1/2015 | Katsuki | H01L 21/26506 |
| | | | 438/275 |
| 2015/0228748 A1* | 8/2015 | Alptekin | H01L 21/823462 |
| | | | 257/401 |
| 2016/0064228 A1* | 3/2016 | van Bentum | H01L 29/516 |
| | | | 257/295 |
| 2016/0111549 A1* | 4/2016 | Baars | H01L 21/823462 |
| | | | 257/295 |
| 2022/0115508 A1* | 4/2022 | Lin | H01L 27/0922 |
| 2022/0406606 A1* | 12/2022 | Lin | H01L 29/66545 |
| 2023/0019366 A1* | 1/2023 | Chen | H01L 21/28202 |
| 2023/0335641 A1* | 10/2023 | Cheng | H01L 29/6656 |

* cited by examiner

MANUFACTURING METHOD FOR INTEGRATING GATE DIELECTRIC LAYERS OF DIFFERENT THICKNESSES

CROSS-REFERENCES TO RELATED APPLICATIONS

This application claims the priority to Chinese patent application No. CN202011201972.9 filed on Nov. 2, 2020, and entitled "MANUFACTURING METHOD FOR INTEGRATING GATE DIELECTRIC LAYERS OF DIFFERENT THICKNESSES", the disclosure of which is incorporated herein by reference in entirety.

TECHNICAL FIELD

The present application relates to a method for manufacturing a semiconductor integrated circuit, in particular to a manufacturing method for integrating gate dielectric layers of different thicknesses.

BACKGROUND

High-voltage devices often require a thicker gate oxide layer under the gate of the transistor, and the existing integration method for integrating high-voltage devices with low-voltage devices include the following steps: in the semiconductor layer, generally, after a silicon wafer undergoes related processes such as processes of forming a shallow trench isolation (STI) structure and well regions, a layer of nitride film is grown on the surface thereof, then a region of the high voltage device is opened by means of a photolithography process, the nitride film and a sacrificial oxide film are removed by means of etching, the etching stops on the surface of the silicon wafer, and then removing of photoresist and cleaning are performed; an oxide film is then formed in the high-voltage region by means of diffusion; and finally, the nitride film is removed by means of wet etching. The process leaves a step of about 500 Å to 1000 Å height difference between the gate oxide layer of the high-voltage transistor and the gate oxide layer of a low-voltage transistor. The height difference is not conducive to the formation of the gate of the high-voltage device, because in the subsequent chemical mechanical polishing (CMP) process of an interlayer dielectric (ILD), the high-voltage transistor may be over-polished, making it impossible to form an effective gate. The following description explains the problem along with the referenced drawings:

Referring to FIGS. 1A-1E, which are schematic structural diagrams of a device in each step of an existing manufacturing method for integrating gate dielectric layers of different thicknesses. In an example, the gate dielectric layer is a gate silicon oxide layer having two different thicknesses: a thick gate oxide layer for a high-voltage device, and a thin gate oxide layer for a low-voltage device. The existing method includes the following steps:

Step 1. Referring to FIG. 1A, a first mask layer 104 is formed on the top surface of the semiconductor substrate 101.

Generally, the semiconductor substrate 101 includes a silicon substrate.

Before each of the gate dielectric layers is formed, a shallow trench isolation structure 102 and well regions corresponding to the semiconductor devices operating at different voltages are formed on the semiconductor substrate 101.

In FIG. 1A, a region corresponding to the brace 201 is a region to form the high-voltage device; and the other regions corresponding to the braces 202 are for the low-voltage device.

A fourth silicon oxide layer 103 is formed on the substrate. The first mask layer 104 is disposed on the fourth silicon layer 103, and it is the third silicon nitride layer.

The fourth silicon oxide layer 103 serves as a pad oxide layer. The fourth silicon oxide layer 103 is usually removed in a subsequent process and therefore is also referred to as a sacrificial oxide layer.

Step 2. Referring generally to FIG. 1B, the region 201 is opened by means of a photolithography process, that is, the opened region 201 is obtained by means of coating, exposing, and developing with a photoresist.

Then, referring to FIG. 1C, etching, such as dry etching, is performed on the first mask layer 104 by using a pattern of the photoresist as a mask, to remove the first mask layer 104 in the opened region 201, and the fourth silicon oxide layer 103 is also removed.

Step 3. Referring to FIG. 1D, a fifth silicon oxide layer 106 is formed by means of a diffusion thermal oxidation process. The fifth silicon oxide layer 106 serves as a thick gate oxide layer. Therefore, the fifth silicon oxide layer 106 needs to meet a required thickness for the thick gate oxide layer, in which case the top surface of the fifth silicon oxide layer 106 is higher than the top surface of the semiconductor substrate 101 by a predetermined distance.

Step 4: Referring to FIG. 1E, the first mask layer 104 is removed.

The first mask layer 104 is usually removed by means of a wet etching process using phosphoric acid as an etchant.

Then, the fourth silicon oxide layer 103 is removed, and a thinner gate oxide layer 107 is formed by means of a diffusion thermal oxidation process, in which case the diffusion thermal oxidation process of the thinner gate oxide layer 107 may cause the fifth silicon oxide layer 106 to grow deeper, thereby increasing the thickness of the already thick gate oxide layer. Alternatively, the fourth silicon oxide layer 103 may directly serve as the thin gate oxide layer 107, in which case the thickness of the fourth silicon oxide layer 103 needs to be pre-configured to meet the required thickness of the thin gate oxide layer 107.

In the existing method, there is the step structure between the top surface of the thick gate oxide layer, i.e., the fifth silicon oxide layer 106 and the top surface of the thin gate oxide layer 107, and the height of the step structure is represented by d101 in FIG. 1E. The existence of the step structure may cause the gate structure of the high-voltage device fail because the steps taken to satisfy requirements in a subsequent gate structure formation process.

BRIEF SUMMARY

The present application provides a manufacturing method for integrating gate dielectric layers of different thicknesses, whereby a step height between the top surfaces of the gate dielectric layers at different thicknesses can be lowered or eliminated, such that the top surfaces of the gate dielectric layers of different thicknesses can be flush with each other, thereby enabling proper gate forming in the later process.

According to embodiment of the disclosure, the method for manufacturing semiconductor devices with gate dielectric layers at different thicknesses, comprises:

providing a semiconductor substrate for the semiconductor devices, wherein the semiconductor devices operate at different voltages associated with the gate dielectric layers at different thicknesses, wherein a thinner gate dielectric layer results in a lower operating voltage, wherein a gate dielectric layer at a thickness other than a minimum thickness is fabricated by following steps:

step 1: forming a first mask layer on a top surface of the semiconductor substrate;

step 2: patterning a region for one of the semiconductor devices and removing the first mask layer in the region to form a first opening, wherein said one of the semiconductor devices is configured to have a gate dielectric layer at a desired thickness;

step 3: forming a second groove at a bottom of the first opening by etching, wherein a depth of the second groove is configured to be the desired thickness of the gate dielectric layer of said semiconductor device;

step 4: filling the second groove and the first opening with a second material layer which relates to said gate dielectric layer;

step 5: forming said gate dielectric layer by etching back the second material layer, wherein a top surface of the second material layer is flush with a top surface of the semiconductor substrate;

step 6: removing a remaining portion of the first mask layer; and repeating the steps 1 to 6 to form the gate dielectric layers of different thicknesses, wherein top surfaces of the gate dielectric layers of different thicknesses are configured to be at a same level.

In some examples, a gate dielectric layer of the minimum thickness is fully formed on the top surface of the semiconductor substrate.

In some examples, the gate dielectric layer of the minimum thickness can be formed before or after the gate dielectric layers of thicknesses other than the minimum thickness are firmed.

In some examples, the semiconductor substrate comprises a silicon substrate.

In some examples, a shallow trench isolation structure and well regions for the semiconductor devices are formed on the semiconductor substrate before each of the gate dielectric layers is formed.

In some examples, the first mask layer comprises a third silicon nitride layer and a fourth silicon oxide layer at a bottom of the first mask layer.

In some examples, the second material layer comprises a silicon oxide layer.

In some examples, the step 4 further comprises sub-steps of: forming a fifth silicon oxide layer by means of a diffusion thermal oxidation process, wherein a top surface of the fifth silicon oxide layer is disposed in the first opening between the top surface of the semiconductor substrate and a top surface of the first mask layer;

forming a sixth silicon oxide layer by means of a full deposition process, wherein the sixth silicon oxide layer is grown on the top surface of the fifth silicon oxide layer and the top surface of the first mask layer, wherein the sixth silicon oxide layer fully fills a remaining region of the first opening on the top surface of the fifth silicon oxide layer, and wherein the top surface of the sixth silicon oxide layer is higher than the top surface of the first mask layer; and removing a portion of the sixth silicon oxide layer from the top surface of the first mask layer by means of a chemical mechanical polishing process, wherein the top surface of the sixth silicon oxide layer in the first opening is flush with the top surface of the first mask layer, and wherein the second material layer is formed by stacking the fifth silicon oxide layer and a remaining portion of the sixth silicon oxide layer.

In some examples, in step 6, the first mask layer is removed by means of a wet etching process.

In some examples, phosphoric acid is applied as an etchant of the wet etching process for removing the third silicon nitride layer of the first mask layer.

In some examples, the semiconductor devices comprises a high operating voltage device and a low operating voltage device, and wherein the gate dielectric layer of the high operating voltage device is formed by the steps 1 to 6.

In some examples, a process node of the semiconductor device is 28 nm and below.

In some examples, the depth of the second groove is in a range of 300 Å-1000 Å.

In some examples, the method further comprises a subsequent step of forming a gate conductive material layer on a surface of said gate dielectric layer.

In some examples, the gate conductive material layer comprises one of a polysilicon gate and a metal gate.

In the present application, for a relatively thick gate dielectric layer, after the formation region is opened, the gate dielectric layer of a corresponding thickness is not directly formed, in this case, the semiconductor substrate in the opened region is etched to form the second groove, the depth of which is determined according to the thickness of the gate dielectric layer to be formed, and then filling and etching-back processes are performed on the second material layer corresponding to the gate dielectric layer to form the gate dielectric layer having a top surface flush with the top surface of the semiconductor substrate. Since the top surfaces of different relatively thick gate dielectric layers are all flush with the top surface of the semiconductor substrate, a step of the top surfaces of the gate dielectric layers of different thicknesses can be lowered or eliminated, such that the top surfaces of the gate dielectric layers of different thicknesses can be flush with each other, thereby facilitating subsequent formation of a gate.

BRIEF DESCRIPTION OF THE DRAWINGS

The present application will be further described in detail below with reference to the drawings and specific implementations.

DETAILED DESCRIPTION OF THE DISCLOSURE

Figure 1A:
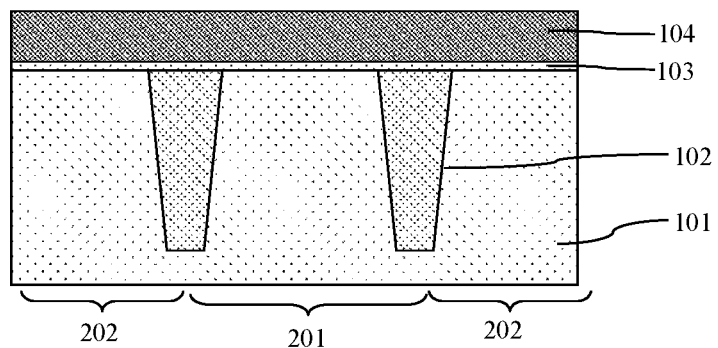
FIGS. 1A-1E are schematic structural diagrams of a device in each step of an existing manufacturing method for integrating gate dielectric layers of different thicknesses.
Figure 1B:
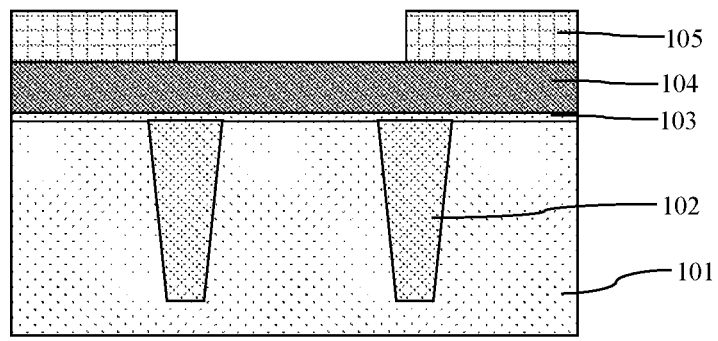
Figure 1C:
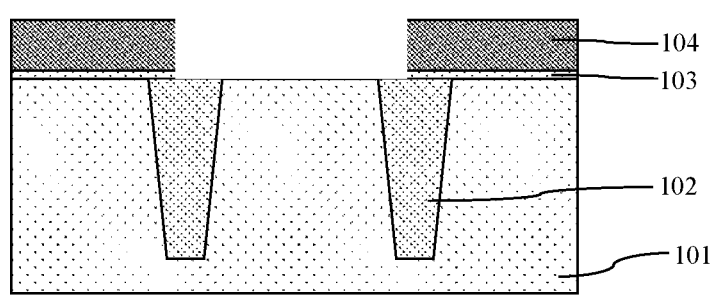
Figure 1D:
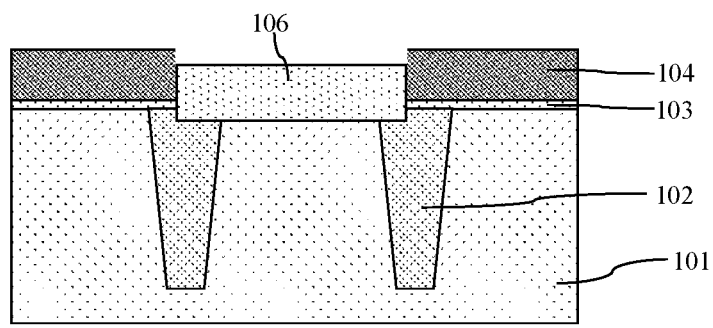
Figure 1E:
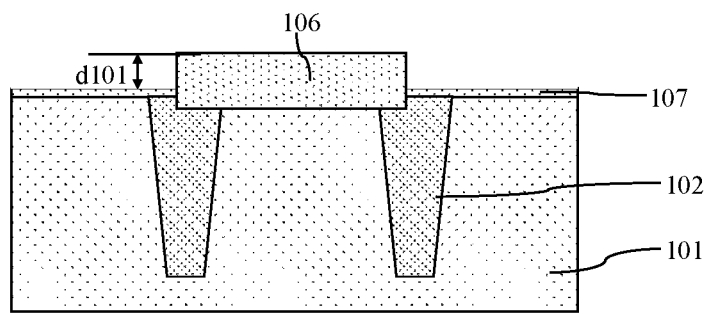
Figure 2:
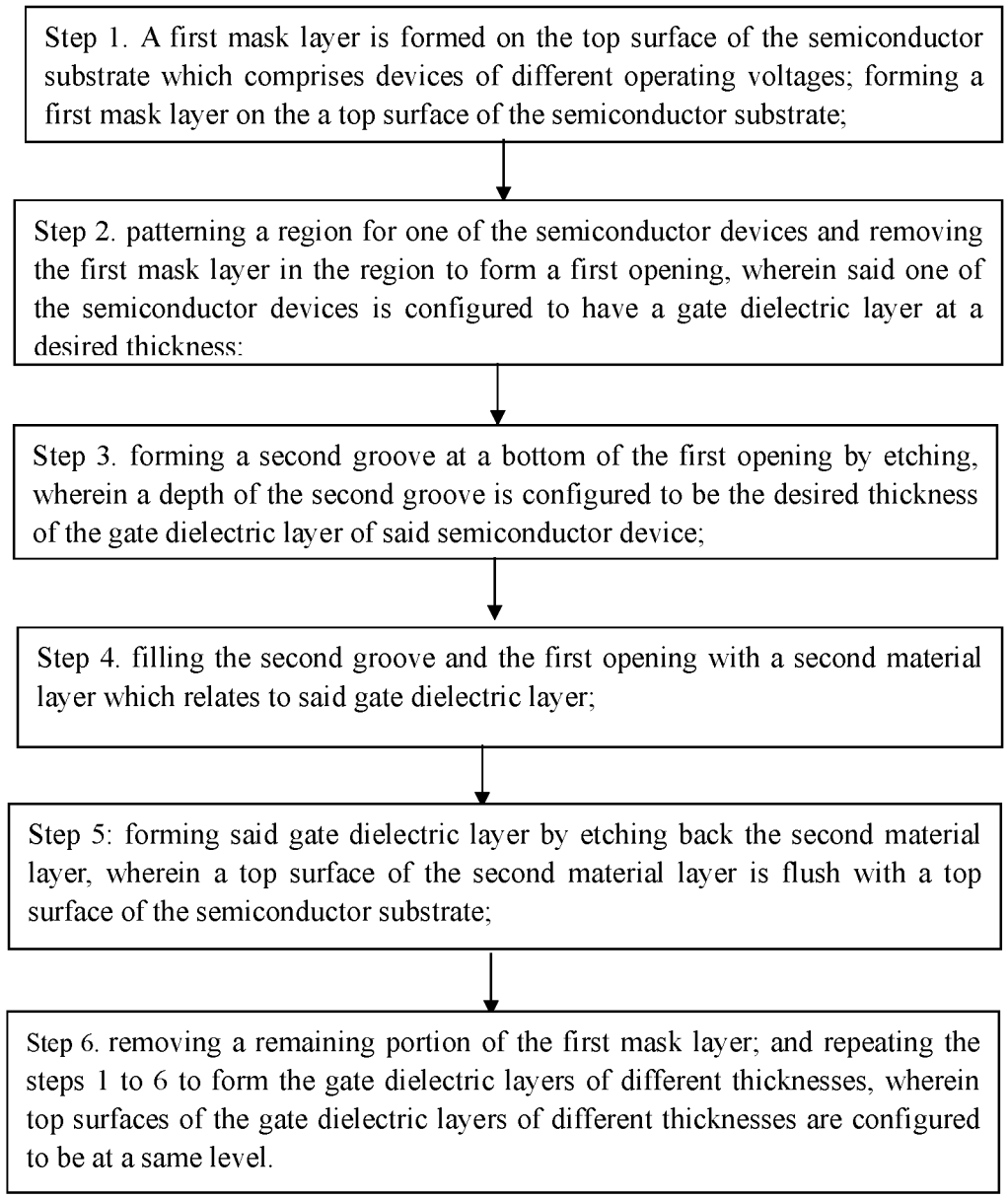
FIG. 2 is a flow chart of a manufacturing method for integrating gate dielectric layers of different thicknesses according to an embodiment of the present application.

FIG. 2 is a flow chart of a manufacturing method for integrating gate dielectric layers of different thicknesses according to an embodiment of the present application; and FIGS. 3A-3I are schematic structural diagrams of a device in each step of the manufacturing method for integrating gate dielectric layers of different thicknesses according to an embodiment of the present application. This method includes the following steps: provide a semiconductor substrate 1, which has at least two regions for forming two semiconductor devices operating at two different voltages. The gate dielectric layers of the semiconductor devices of different operating voltages are often configured to have different thicknesses, for example, a thinner gate dielectric layer results in a lower operating voltage for the semiconductor device. In general, the gate dielectric layers of different thicknesses, excluding those of the minimum thickness, are formed by means of the following steps.

Figure 3A:
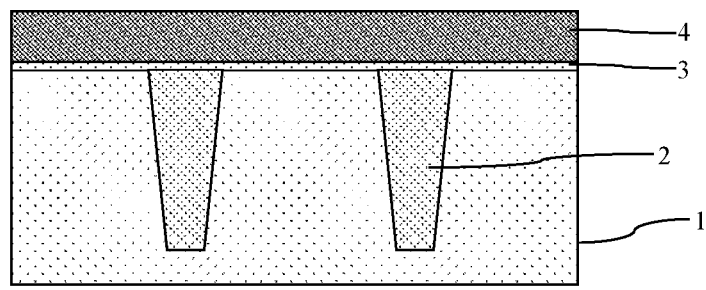
FIGS. 3A-3I are schematic structural diagrams of a device in each step of the manufacturing method for integrating gate dielectric layers of different thicknesses according to an embodiment of the present application.

Step 1. Referring to FIG. 3A, a first mask layer 4 is formed on the top surface of the semiconductor substrate 1, wherein semiconductor devices of different operating voltages are placed on the semiconductor substrate 1.

In the embodiment of the present application, the semiconductor substrate 1 includes a silicon substrate.

Shallow trench isolation structures 2 and well regions are formed respectively for the semiconductor devices of different operating voltages on the semiconductor substrate 1, followed by forming each of the corresponding gate dielectric layers.

The first mask layer 4 comprises a third silicon nitride layer.

The first mask layer 4 is formed on the fourth silicon oxide layer 3. The fourth silicon oxide layer 3 serves as a pad oxide layer.

Step 2. Referring to FIG. 3C, part of the first mask layer 4 is removed to form a first opening 6, wherein the opening is configured such that a gate dielectric layer meet a required thickness.

Figure 3B:
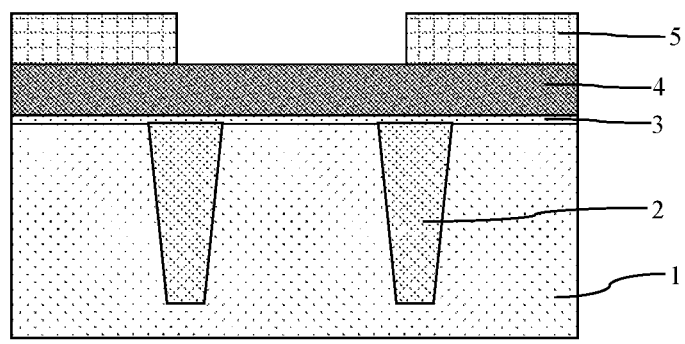
Figure 3C:
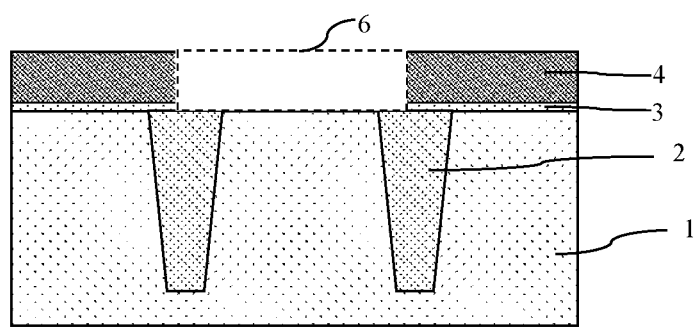

In the embodiment of the present application, referring to FIG. 3B, the semiconductor device having the gate dielectric layer meeting the required thickness is defined by means of a photolithography process, in which the opened region is obtained by means of coating, exposing, and developing with a photoresist 5.

Then, etching is performed on the first mask layer 4 by using a pattern of the photoresist 5 as a mask, to form the first opening 6. The etching may be a dry etching.

Subsequently, referring to FIG. 3C, the photoresist 5 is removed.

Figure 3D:
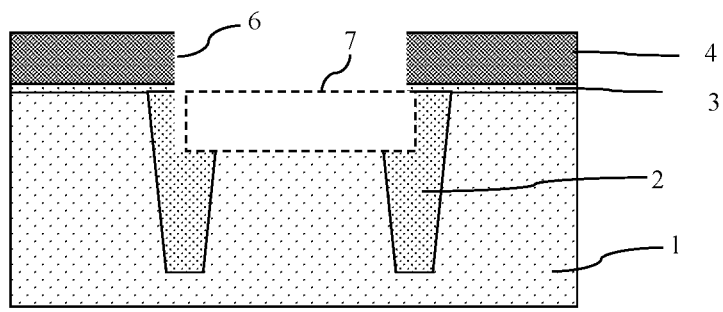

Step 3. Referring to FIG. 3D, etching is performed on the first opening to form a second groove 7 in the semiconductor substrate 1, wherein the depth of the second groove 7 is configured such that the gate dielectric layer meet the required thickness.

Step 4. Referring to FIG. 3G, disposing a second material layer 8 corresponding to the gate dielectric layer to fill the second groove 7 and the first opening 6.

In the embodiment of the present application, the second material layer 8 corresponding to the gate dielectric layer is a silicon oxide layer. The formation of the second material layer 8 includes the following sub-steps.

Figure 3E:
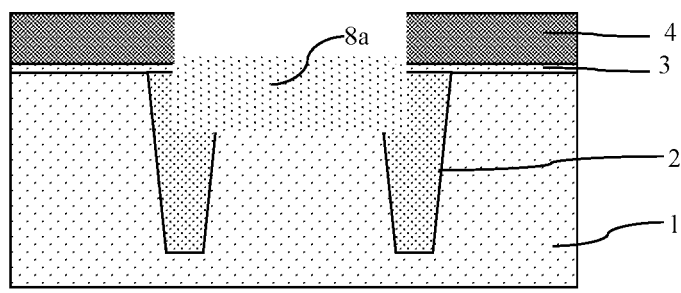

Referring to FIG. 3E, a fifth silicon oxide layer 8a is formed by means of a diffusion thermal oxidation process, wherein the top surface of the fifth silicon oxide layer 8a is located in the first opening 6 between the top surface of the semiconductor substrate 1 and the top surface of the first mask layer 4. Since the fifth silicon oxide layer 8a is formed by means of a diffusion thermal oxidation process and the outer surface of the first opening 6 is the first mask layer 4, the fifth silicon oxide layer 8a is necessarily not formed on the surface of the first mask layer 4, and the fifth silicon oxide layer 8a grows upward above the surface of the semiconductor substrate 1 and extends into the first opening 6.

Figure 3F:
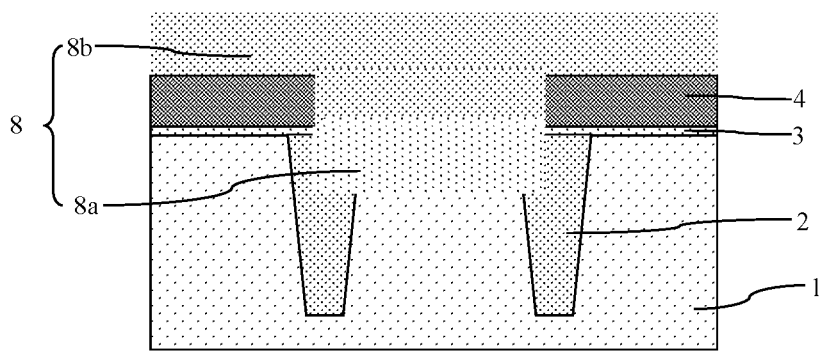
Figure 3G:
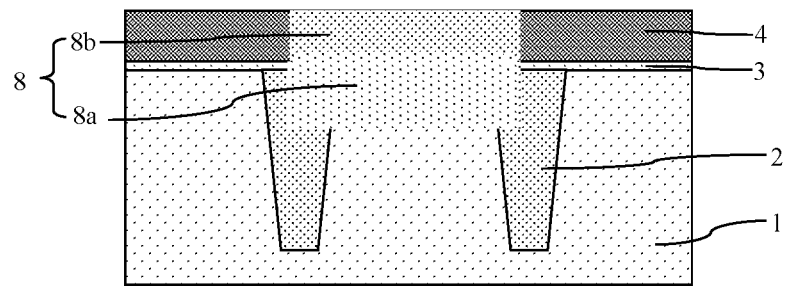

Referring to FIG. 3F, a sixth silicon oxide layer 8b is formed by means of a deposition process on the first mask layer, wherein the sixth silicon oxide layer 8b is grown on the surfaces of both the fifth silicon oxide layer 8a and the first mask layer 4, the sixth silicon oxide layer 8b fully fills a remaining region of the first opening 6 on the top of the fifth silicon oxide layer 8a, and the top surface of the sixth silicon oxide layer 8b is higher than the top surface of the first mask layer 4.

Referring to FIG. 3G, the sixth silicon oxide layer 8b on the top surface of the first mask layer 4 is fully removed by means of a chemical mechanical polishing process, wherein the top surface of the sixth silicon oxide layer 8b in the first opening 6 is flush with the top surface of the first mask layer 4, and the second material layer 8 is formed by stacking the fifth silicon oxide layer 8a and the sixth silicon oxide layer 8b remained after the chemical mechanical polishing process.

Figure 3H:
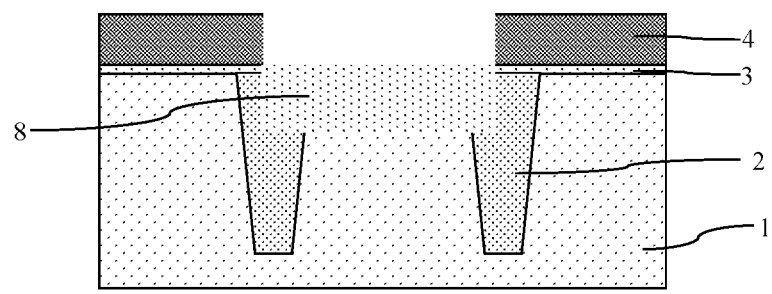

Step 5. Referring to FIG. 3H, the second material layer 8 is etched back, wherein the height of the top surface of the second material layer 8 is controlled by means of etching-back, such that the top surface of the second material layer 8 is finally flush with the top surface of the semiconductor substrate 1, and the etched-back second material layer 8 becomes the gate dielectric layer.

Figure 3I:
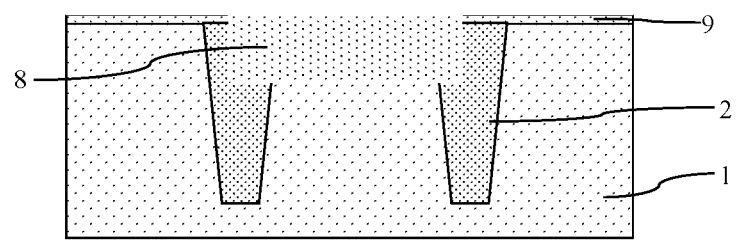

Step 6. Referring to FIG. 3I, the first mask layer 4 is removed.

In the embodiment of the present application, the first mask layer 4 is removed by means of a wet etching process.

Preferably, phosphoric acid is used as an etchant of the wet etching process for removing the third silicon nitride layer of the first mask layer 4.

After the gate dielectric layers of different thicknesses are formed by the above steps 1-6, as the result, the step between two top surfaces of the gate dielectric layers of different thicknesses is reduced or eliminated.

The gate dielectric layer 9 of the minimum thickness is fully formed on the surface of the semiconductor substrate 1. In FIG. 3I, the gate dielectric layer of the minimum thickness is referenced with a numeral 9.

According to the embodiment of the present application, the gate dielectric layer 9 at the minimum thickness is formed after all other gate dielectric layers at thicknesses different from the minimum thickness are formed, for example, the fourth silicon oxide layer 3 is removed first, and then the gate dielectric layer 9 is formed to have the minimum thickness by means of a diffusion thermal oxidation process. In other embodiments, the gate dielectric layer 9 at the minimum thickness is formed before other gate dielectric layers at thicknesses different from minimum thickness, are formed, in this case the fourth silicon oxide layer 3 becomes the gate dielectric layer 9 at the minimum thickness.

Preferably, the semiconductor substrate 1 comprises regions where the semiconductor devices having two operating voltages are formed, these semiconductor devices are respectively a high-voltage device and a low-voltage device, the operating voltage of the high-voltage device is greater than the operating voltage of the low-voltage device, and the gate dielectric layer of the high-voltage device is formed by following steps 1 to 6. The process node in the semiconductor technology roadmap is 28 nm and beyond.

The depth of the second groove 7 is 300 Å-1000 Å.

The method of making the device further includes a subsequent step of forming a gate conductive material layer on the surface of the gate dielectric layer. The gate conductive material layer is a polysilicon gate or a metal gate. Finally, the height of the gate conductive material layer of each of the semiconductor devices is configured by means of a chemical mechanical polishing process of an interlayer dielectric. Since the top surfaces of all the gate dielectric layers are flush with each other, that is, the bottom surface of the gate conductive material layers are flush with each other, and the top surfaces of all the gate conductive material layers are flush with each other as well after the chemical mechanical polishing process of the interlayer dielectric is completed, the height of each gate conductive material layer can be well controlled, thereby avoiding the defect that the height of the gate conductive material layer decreases if the thickness of the gate dielectric layer of the high-voltage device is relatively high.

In the embodiment of the present application, for a relatively thick gate dielectric layer, after the region for forming the device is opened, the gate dielectric layer of a desired thickness is not directly formed, instead in this case, the semiconductor substrate 1 in the opened region is etched to form the second groove 7, the depth of the groove is determined based on the desired thickness of the gate dielectric layer, and next step is filling the groove 7 and performing etching-back process on the second material layer 8, the just formed gate dielectric layer has a top surface which is flush with the top surface of the semiconductor substrate 1. Because the top surfaces of different relatively thick gate dielectric layers are all flush with the top surface of the semiconductor substrate 1, the height difference between the top surfaces of the gate dielectric layers having different thicknesses will be reduced or eliminated, such that the top surfaces of the gate dielectric layers of different thicknesses can be flush with each other, thereby enabling subsequent gate formation.

The present application is described in detail above via specific embodiments, but these embodiments are not intended to limit the present application. Without departing from the principle of the present application, those skilled in the art can still make many variations and improvements, which should also be considered to fall into the protection scope of the present application.

What is claimed is:

1. A method for manufacturing semiconductor devices, wherein the semiconductor devices comprise gate dielectric layers at different thicknesses, the method comprising:
   providing a semiconductor substrate for the semiconductor devices, wherein the semiconductor devices operate at different voltages associated with the gate dielectric layers at different thicknesses, wherein a thinner gate dielectric layer results in a lower operating voltage, wherein a gate dielectric layer at a thickness other than a minimum thickness is fabricated by following steps:
   step 1: forming a first mask layer on a top surface of the semiconductor substrate;
   step 2: patterning a region for one of the semiconductor devices and removing the first mask layer in the region to form a first opening, wherein said one of the semiconductor devices is configured to have a gate dielectric layer at a desired thickness;
   step 3: forming a second groove at a bottom of the first opening by etching, wherein a depth of the second groove is configured to be the desired thickness of the gate dielectric layer of said semiconductor device;
   step 4: filling the second groove and the first opening with a second material layer which relates to said gate dielectric layer;
   step 5: forming said gate dielectric layer by etching back the second material layer, wherein a top surface of the second material layer is flush with a top surface of the semiconductor substrate;
   step 6: removing a remaining portion of the first mask layer; and
   repeating the steps 1 to 6 to form the gate dielectric layers of different thicknesses, wherein top surfaces of the gate dielectric layers of different thicknesses are configured to be at a same level.

2. The method for manufacturing semiconductor devices according to claim 1, wherein a gate dielectric layer of the minimum thickness is fully formed on the top surface of the semiconductor substrate.

3. The method for manufacturing semiconductor devices according to claim 2, wherein the gate dielectric layer of the minimum thickness can be formed before or after the gate dielectric layers of thicknesses other than the minimum thickness are formed.

4. The method for manufacturing semiconductor devices according to claim 1, wherein the semiconductor substrate comprises a silicon substrate.

5. The method for manufacturing semiconductor devices according to claim 4, wherein a shallow trench isolation structure and well regions for the semiconductor devices are formed on the semiconductor substrate before each of the gate dielectric layers is formed.

6. The method for manufacturing semiconductor devices according to claim 4, wherein the first mask layer comprises a third silicon nitride layer and a fourth silicon oxide layer at a bottom of the first mask layer.

7. The method for manufacturing semiconductor devices according to claim 6, wherein in step 6, the first mask layer is removed by means of a wet etching process.

8. The method for manufacturing semiconductor devices according to claim 7, wherein phosphoric acid is applied as an etchant of the wet etching process for removing the third silicon nitride layer of the first mask layer.

9. The method for manufacturing semiconductor devices according to claim 4, wherein the second material layer comprises a silicon oxide layer.

10. The method for manufacturing semiconductor devices according to claim 9, wherein the step 4 further comprises sub-steps of:
    forming a fifth silicon oxide layer by means of a diffusion thermal oxidation process, wherein a top surface of the fifth silicon oxide layer is disposed in the first opening between the top surface of the semiconductor substrate and a top surface of the first mask layer;
    forming a sixth silicon oxide layer by means of a full deposition process, wherein the sixth silicon oxide layer is grown on the top surface of the fifth silicon oxide layer and the top surface of the first mask layer, wherein the sixth silicon oxide layer fully fills a remaining region of the first opening on the top surface of the fifth silicon oxide layer, and wherein the top surface of the sixth silicon oxide layer is higher than the top surface of the first mask layer; and
    removing a portion of the sixth silicon oxide layer from the top surface of the first mask layer by means of a chemical mechanical polishing process, wherein the top surface of the sixth silicon oxide layer in the first opening is flush with the top surface of the first mask layer, and wherein the second material layer is formed by stacking the fifth silicon oxide layer and a remaining portion of the sixth silicon oxide layer.

11. The method for manufacturing semiconductor devices according to claim 9, wherein the semiconductor devices comprises a high operating voltage device and a low operating voltage device, and wherein the gate dielectric layer of the high operating voltage device is formed by the steps 1 to 6.

12. The method for manufacturing semiconductor devices according to claim 11, wherein a process node of the semiconductor device is 28 nm and below.

13. The method for manufacturing semiconductor devices according to claim 12, wherein the depth of the second groove is in a range of 300 Å-1000 Å.

14. The method for manufacturing semiconductor devices according to claim 1, further comprising a subsequent step of forming a gate conductive material layer on a surface of said gate dielectric layer.

15. The method for manufacturing semiconductor devices according to claim 14, wherein the gate conductive material layer comprises one of a polysilicon gate and a metal gate.

\* \* \* \* \*